United States Patent [19]

Chen et al.

[11] Patent Number: 5,097,331

[45] Date of Patent: Mar. 17, 1992

[54] MULTIPLE BLOCK-SIZE TRANSFORM VIDEO CODING USING AN ASYMMETRIC SUB-BAND STRUCTURE

[75] Inventors: Ting-Chung Chen, Lincroft; Paul E. Fleischer, Little Silver, both of N.J.

[73] Assignee: Bell Communications Research, Inc., Livingston, N.J.

[21] Appl. No.: 573,242

[22] Filed: Aug. 24, 1990

[51] Int. Cl.[5] ............................................. H04N 7/12
[52] U.S. Cl. .................................... 358/138; 358/133
[58] Field of Search .................. 358/138, 133, 11, 12, 358/13

[56] References Cited

U.S. PATENT DOCUMENTS

| | | | |
|---|---|---|---|
| 3,981,443 | 9/1976 | Lynch et al. | 235/156 |
| 4,815,023 | 3/1989 | Arbeiter | 358/133 |
| 4,829,378 | 5/1989 | LeGall | 358/133 |
| 4,918,524 | 4/1990 | Ansari et al. | 358/133 |

OTHER PUBLICATIONS

"Discrete Cosine Transform," *IEEE Trans. Comput.* vol. C-23, pp. 90-93, Jan. 1974, N. Ahmed, T. Natarajan and K. R. Rao.
"A Fast Computational Algorithm for the Discrete Cosine Transform" *IEEE Trans. Communications*, vol. COM-25, pp. 1004-1009, Sep. 1977, W. H. Chen, C. H. Smith and S. C. Fralick.
"Compatible HDTV Coding for Broadband ISDN," *IEEE Globecom*, Florida, Dec. 1988, 1988, K. H. Tzou, T. C. Chen, P. E. Fleischer and M. I. Liou.

*Primary Examiner*—James J. Groody
*Assistant Examiner*—Kim Yen Vu
*Attorney, Agent, or Firm*—Leonard Charles Suchyta; Stephen M. Gurey

[57] ABSTRACT

A sub-band coder for video signals is disclosed, which is easily realizable in VLSI due to its simple structure. The coder uses sets of two-tap finite impulse response (FIR) filters having equal-magnitude coefficients to decompose the video signal at multiple stages. In the preferred embodiment the sub-band coder has an asymmetrical structure. With the arrangement, the sub-band decomposition effects what is equivalent to a multiple block-size Hadamard transform of the video signal in which coefficients are transmitted from various block-sized transforms of larger blocks of pixel data.

10 Claims, 6 Drawing Sheets

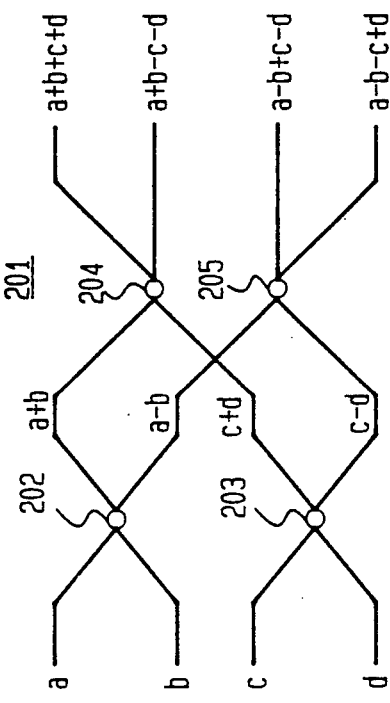
FIG. 2A
FIG. 2B
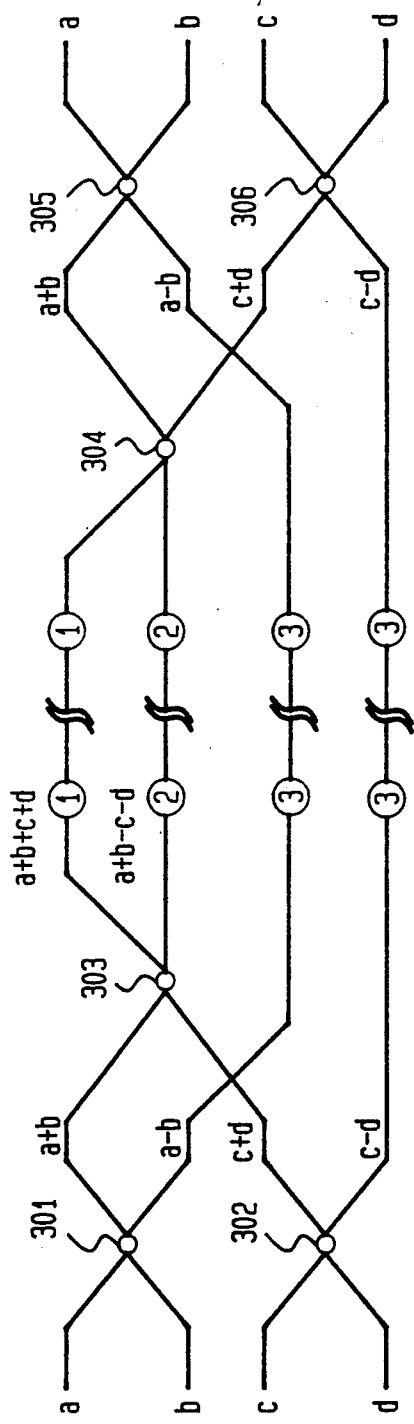
FIG. 3

MULTIPLE BLOCK-SIZE TRANSFORM VIDEO CODING USING AN ASYMMETRIC SUB-BAND STRUCTURE

BACKGROUND OF THE INVENTION

This invention relates to video signal transmission techniques known as transform coding and sub-band coding. More particularly, the present invention relates to a particular coding scheme that uses transform coding, which can be implemented using a very simple sub-band structure with low hardware complexity.

The Broadband Integrated Services Digital Network (BISDN) is a new concept for exchange area communications. Based on lightwave technology, high-speed circuit and packet switching, and intelligent networking, BISDN will integrate various services such as voice, data, and video under the same umbrella as POTS (Plain Old Telephone Service). Initially, video is likely to be one of the more attractive services and can therefore be expected to present a significant portion of the traffic to the BISDN network. Conversely, high quality video signals represent the service most in need of the broad bandwidth of BISDN. For these reasons, the digital coding of video signals in a form suitable for transmission through the proposed BISDN is of great interest and importance.

The coding of high-definition television (HDTV) signals for transmission through the BISDN is particularly important since the emerging fiber optic network may provide the most viable means for delivering very high image quality and avoiding transmission impairments. The digital coding, transmission, and switching of video signals will offer considerable advantages over conventional analog distribution in terms of image quality, control, and in the variety of services that can be offered to the customer. In the network, digitally encoded TV signals are robust, i.e., they are not susceptible to the gradual increase of distortion and noise that typically accumulates during the various stages of transmission, multiplexing, and switching of conventional analog-encoded signals. Also, digital video signals are much easier to integrate (switching, multiplexing, etc.) with other digital services and they can be readily encrypted to provide security or control. Digital codecs (coder/decoders) can be designed to take advantage of VLSI (very large scale integrated) circuits to realize the digital signal processing required to remove redundancy from the signal and thus reduce the bit rate to the available line rate.

Various image compression techniques have been investigated for removing the inherent redundancy in video signals. One commonly used technique uses the decomposition of the signal into different frequency components/bands for separate encoding. Because the human visual system (HVS) is less sensitive to high band errors, it is possible to code these more coarsely thereby achieving a coding gain. Many coding techniques that decompose the signal into multiple bands have been proposed and they have proved to be more effective than straightforward one-band coding like DPCM. Examples are, transform coding, (see e.g. N. Ahmed, T. Natarajan, and K. R. Rao, "Discrete cosine transform," *IEEE Trans. Comput.*, vol. C-23, pp. 90-93, January 1974; W. H. Chen, C. H. Smith, and S. C. Fralick, "A fast computational algorithm for the discrete cosine transform," *IEEE Trans. Commun.*, vol COM-25, pp. 1004-1009, September 1977; and K. H. Tzou, T. C. Chen, P. E. Fleischer and M. L. Liou, "Compatible HDTV coding for broadband ISDN," *IEEE Globecom*, Florida, December 1988), sub-band coding (see e.g. H. Gharavi and A. Tabatabai, "Sub-band coding of monochrome and color images," *IEEE Trans. Circuits Systems*, vol. CAS-35, pp. 207-214, February 1988; D. Le Gall, H. Gaggioni and C. T. Chen, "Transmission of HDTV signals under 140 Mbits/s using a sub-band decomposition and discrete cosine transform coding," *Proc. 2nd Int. Workshop on Signal Processing of HDTV*, 29 Feb.-2 Mar. 1988, L'Aquila Italy; and D. Le Gall and A. Tabatabai, "Sub-band coding of digital images using symmetric short kernel filters and arithmetic coding techniques," *Proc. ICASSP-88*, pp. 761-764, New York, N.Y., Apr. 11-14, 1988), and pyramid coding (see e.g. P. J. Burt and E. H. Adelson, "The Laplacian pyramid as a compact image code," *IEEE Trans. Comm.*, vol. COM-31, pp. 532-540, April 1983; and T. C. Chen, K. H. Tzou and P. E. Fleischer, "A hierarchical HDTV coding system using a DPCM-PCM approach," *SPIE Visual Comm. Image Proc.*, vol 1001, Cambridge, Mass., November 1988). Some basic literature related to transform coding and sub-band coding can also be found in W. K. Pratt, "Digital image processing," New York: Wiley, 1978; W. H. Chen and W. K. Pratt, "Scene adaptive coder," *IEEE Trans. Commun.*, vol. 32, no. 3, 1984; and M. J. T. Smith and T. P. Barnwell, "Exact reconstruction techniques for tree-structured subband coders," *IEEE Trans. ASSP*, vol. ASSP-34, no. 3, June 1986.

In general, transform coding and sub-band coding are alternative image compression techniques. In transform coding, blocks of pixel information are transformed using a prescribed signal transformation. In particular, each input block is transformed into an equal-sized block of transform coefficients by using algorithms that combine the pixel magnitude information in the block in a prescribed manner. The resultnat coefficients in the transformed blocks are quantized and otherwise compressed and then transmitted to a receiver where the received coefficients in each block are inversely transformed back to the pixel domain. Since the perceived video quality is more dependent on certain of the coefficients than others in each transformed block, coding efficiency is obtained by using coarser quantization schemes for the less significant coefficients. The size of the input blocks is another factor affecting coding efficiency in transform coding. It is generally agreed that larger block-size image transform coding decorrelates the signal better and thus generates a lower coding rate. A problem attending the use of large block sizes is that the resulting image quality is not consistent, blocking and ringing artifacts being often visible. In terms of picture quality, it is preferable to have a smaller block-size transform so that quantizers can be designed to fit the signal better and to minimize the quantization noise spread.

In sub-band coding the input signal is decomposed into several bands that are separably decimated and coded for the purpose of transmission. Unlike transform coding in which blocks of pixels need be stored and processed, sub-band coding is processed in real time. For reconstruction after transmission, the individual bands are decoded, interpolated, filtered and added in order to reproduce the original signal. For video signals, separable filter banks may be applied both horizontally and vertically. Each of the resulting bands may then be further decomposed. After decomposition, each band is encoded according to its own statistics. The higher frequency bands that least affect the human perception of video quality are quantized with coarser quantizing schemes than the lower frequency bands.

The choice of the analysis and synthesis filter banks that are used to decompose and reconstruct the video signal is a very important part of the design of a sub-band coder. One approach is to use Quadrature Mirror Filters (QMFs) which, in the absence of channel and quantization noise, permit an alias-free and near perfect reconstruction of the input signal (see e.g. D. Esteban and C. Galand, "HQMF: Halfband Quadrature Mirror Filters," *Proc.* 1981 *Int. Conf. Acoust. Speech Signal Processing*, pp. 220–223, April, 1981). A disadvantage of the QMF approach is that the resulting filters do not permit exact reconstruction of the original video signal, although amplitude distortion can be made small by using long, finite impulse response filters. Such long, multiple-tap filters are difficult to implement, particularly for high speed applications such as the coding of HDTV signals. Short kernel filters, on the other hand, allow simpler implementation but the frequency responses of such short kernel filters do not have the sharp and symmetrical transition characteristics of QMF pairs. A class of short kernel symmetric analysis/synthesis filter banks with a perfect reconstruction capability is presented in the aforenoted reference by Le Gall and Tabatabai and in U.S. Pat. No. 4,829,378 issued June 8, 1988 to Le Gall. In that reference, a simple two-tap finite impulse response (FIR) filter is considered but rejected for practical use for video coding for the reason that the type of artifacts introduced by quantization noise make the resulting picture visually unpleasant.

An object of the present invention is to achieve high compression coding of video signals using techniques that can be implemented for high speed applications with low hardware complexity.

SUMMARY OF THE INVENTION

The present invention is a coding technique for video signals that lies at the intersection of transform coding and multi-stage sub-band coding. In particular, the coding technique of the present invention effects a Hadamard transform coding (see e.g. W. K. Pratt, supra pp. 250–254, 266–270.) that is implemented using a set of two-tap equal-magnitude coefficient FIR filters in a simple multi-stage sub-band structure. Contrary to what is expected according to the prior art literature, the use of the two-tap filters in multiple stages to effect the Hadamard transform produces an image quality that is robust with respect to available bit rate. Advantageously, the modularity of the two-tap filter structure permits a low complexity VLSI realization that is particularly important in high speed applications while still retaining considerable flexibility to allow efficient coding. Furthermore, employing a asymmetrical sub-band decomposition using the two-tap filter structure effects a multiple block-size Hadamard transform which has been found have better performance than a single block-size transform.

BRIEF DESCRIPTION OF THE DRAWING

FIG. 2A is a prior art butterfly structure for a 2×1 Hadamard transform;

FIG. 2B is a prior art butterfly structure for a 4×1 Hadamard transform;

FIG. 3 shows the decomposition and reconstruction of a 4×1 and 2×1 multiple block-size Hadamard transform;

FIG. 4 is an example of an 8-pixel by two-line picture block;

FIG. 5 shows the multiple block-size Hadamard decomposition of the picture block in FIG. 4;

DETAILED DESCRIPTION

Figure 1:
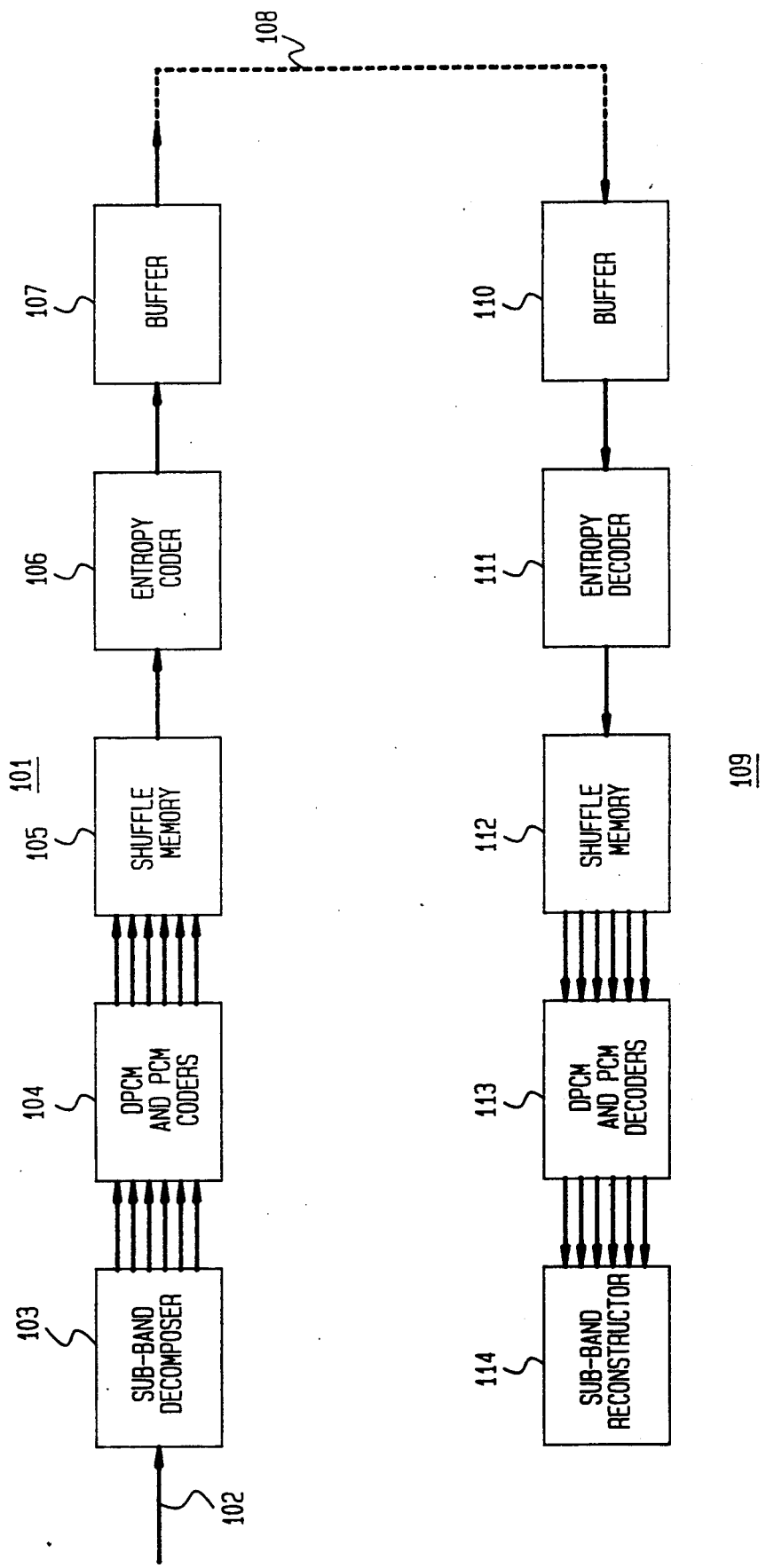
FIG. 1 is a block diagram of a sub-band transmission system for video signals in which our invention may be employed.

A transmission system incorporating the transform-/sub-band coding technique of the present invention is shown in FIG. 1. At the transmitting end 101, a discrete time video signal to be transmitted is inputed on line 102 to a sub-band decomposer 103, which decomposes the input signal into six bands. Sub-band decomposer 103 performs the energy packing i.e., signal decorrelation functions. In this context the energy packing operation corresponds to the ability to split the frequency spectrum into different sub-bands where generally the lowest sub-band will have the highest energy. The signal decorrelation function allows the statistics of each sub-band data to be better matched by the entropy coder. Sub-band decomposer 103 will be described in detail hereinafter.

The lowest band of sub-band decomposer 103 is differentially coded (DPCM) while the other five bands are PCM coded by DPCM and PCM coders 104. Sub-band decomposer 103 and DPCM and PCM coders 104 together form a sub-band coder.

A shuffle memory 105 is connected to DPCM and PCM coders 104. Shuffle memory 105 functions to multiplex the six band data into a single band at the system clock rate, and to "shuffle" the data during multiplexing so that each band is outputted in sequence. The output of shuffle memory 105 is connected to entropy coder 106. Entropy coder 106 is a statistical coder having a set of coding tables that have been optimized for wide band video signals. These tables provide a mapping function for both zero runs and magnitude events, employing run-length and variable word-length encoding. Separate tables are employed for the different decomposed sub-bands. The output of entropy coder 106 is input to a buffer 107 which outputs a bit stream at a constant bit rate onto the transmission channel 108. The buffer also exercises feedback control over the average bit rate it receives to prevent its overflow.

At the receiving end 109, the bit stream received over transmission channel 108 is input to a buffer 110 which is connected to entropy decoder 111. Entropy decoder 111 decodes the run-length and variable length information for the six channels and inputs the decoded DPCM and PCM code words into shuffle memory 112. Shuffle memory 112 "unshuffles" the decoded bit stream to form the six parallel sub-band channels. DPCM and PCM decoders 113 convert the quantized DPCM and PCM levels back into magnitude levels for each of the six channels. Sub-band reconstructor 114 reconstructs the six channels back into a discrete video signal. DPCM and PCM decoders 113 and sub-band reconstructor 114 together form a sub-band decoder.

The discussion that follows focuses on the transform-/sub-band coding technique of the present invention and its implementation with multiple short kernel filters. The conventional implementation of transform coding requires matrix and inverse matrix multiplications to decompose and reconstruct the signal. Butterfly structures are normally used to decompose matrix multiplications into simple pair-wise operations so that the number of multiplications can be minimized. The decomposed butterfly structure is quite involved for the commonly used cosine transform except for the trival $2 \times 1$ case. In contrast, the butterfly structure of the Hadamard transform (HT) is very regular. FIG. 2A shows the basic prior art $2 \times 1$ structure and FIG. 2B shows the basic prior art $4 \times 1$ structure. As can be noted, the $2 \times 1$ butterfly 200 in FIG. 2A transforms the input pixel elements "a" and "b" into output elements "a+b" and "a−b". A scale factor of ½ exists for each output element but is not included in order to simplify the drawing and the text. The $4 \times 1$ structure 201 in FIG. 2B consists of two stages of two $2 \times 1$ structures, 202, 203, 204, and 205. The consecutive input pixel elements "a", "b", "c", and "d", are transformed into output elements "a+b+c+d", "a+b−c−d", "a−b+c−d", and "a−b−c+d" (scale factor not included).

An important consequence of this regularity is that a properly chosen set of transformed coefficients selected from several different size transforms can be combined to reconstruct the original signal perfectly. A simple example of this property is shown in FIG. 3, where a $4 \times 1$ block is decomposed in a mixed fashion through one or two stages and then perfectly reconstructed by the mixed inverse set of operations. Assume the four pixels in a $4 \times 1$ block are represented as {a, b, c, d}, as in FIG. 2B. First, $2 \times 1$ HTs are applied to {a,b} and {c,d} separately by butterfly structures 301 and 302, respectively. The (2,1) or (second column, first row) coefficient from each transform is retained. The two (1,1) coefficients from these transforms then undergo a further $2 \times 1$ HT by butterfly 303 and the two resulting coefficients are also retained. Note that the last two coefficients are equivalent to the (1,1) and (2,1) coefficients of the $4 \times 1$ HT of {a,b,c,d}. The signal can be perfectly reconstructed from this mixed set of four coefficients by performing the inverse set of one and two stage transformations through butterfly structures 304, 305 and 306.

Figures 4, 5:
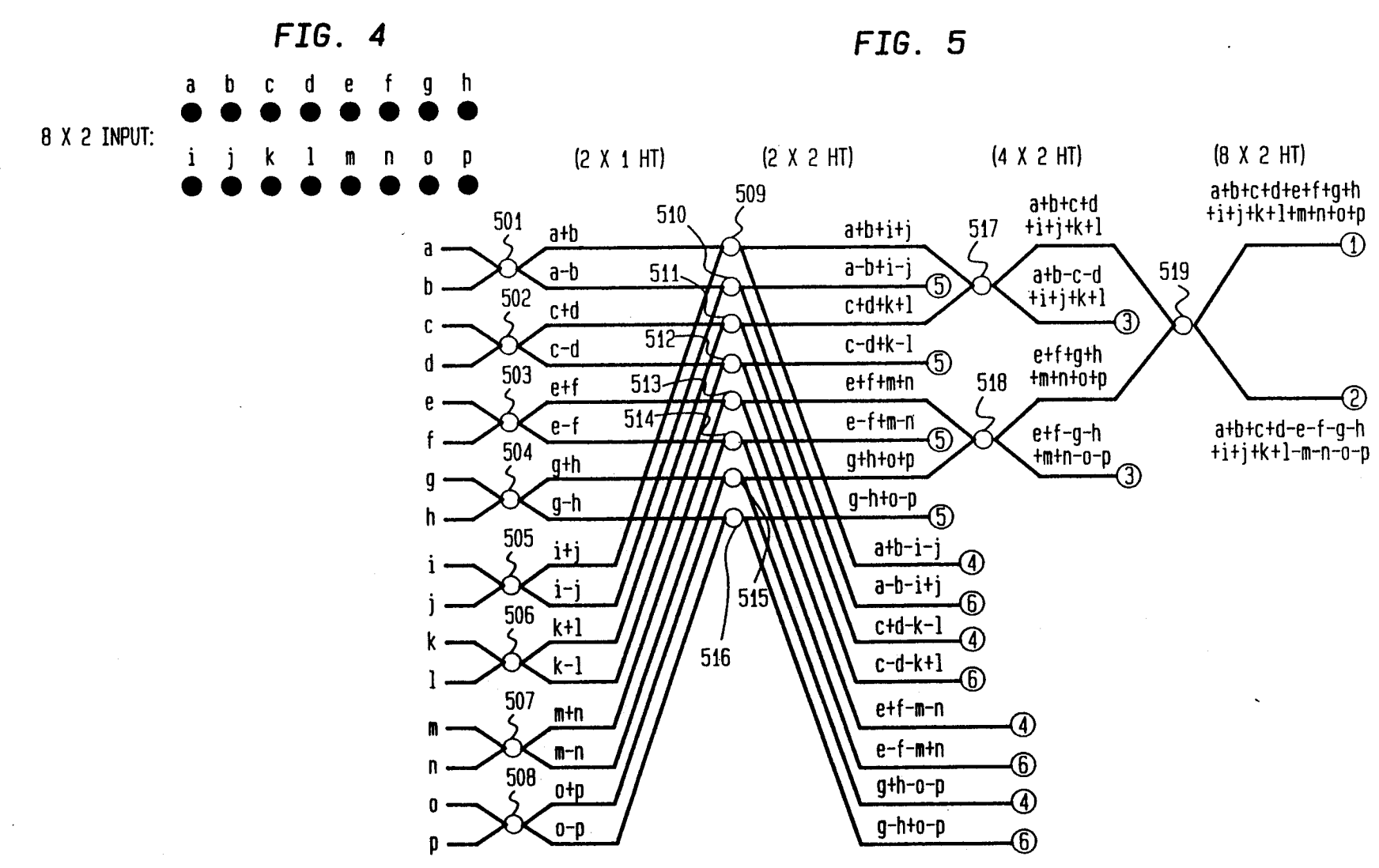

When this process is expanded to a larger block size the results become more interesting and our invention is a direct example thereof. As an example, consider the 8-pixel by 2-line picture block shown in FIG. 4. The decomposition of this block, shown in FIG. 5, is obtained by two, three, or four repeated applications of the simple butterfly structure of FIG. 2A which, as aforenoted, forms the sum and difference of its applied input signals. As can be noted in FIG. 5, butterflys 501–508 form the sums and differences of adjacent pixels on each line which is the equivalent of the $2 \times 1$ HT. Butterflys 509–516 then combine the outputs of the first transformation in to form 16 outputs representing four $2 \times 2$ Hadamard transforms. At the third stage, butterflys 517 and 518 each combine two selected outputs of the second stage to form four outputs representing portions of two separate $4 \times 2$ Hadamard transforms. At the fourth stage, butterfly 519 combines two of these transforms to produce two outputs corresponding to two coefficients of an $8 \times 2$ Hadamard transform.

The final decomposition consists of 12 coefficients selected from four $2 \times 2$ HTs (labeled bands 4, 5 and 6), two coefficients selected from two $4 \times 2$ HTs (labeled band 3) and two coefficients from one $8 \times 2$ HT (labeled bands 1 and 2). An inverse set of multistage operations (not shown), based on the same simple butterfly, will yield the perfect reconstruction. Thus, by transmitting these coefficients from multiple block size Hadamard transforms, a receiver can perfectly reconstruct the input pixels. It can be verified that this flexibility is a unique feature of the HT and does not exist for most of the other well known transforms e.g., the cosine, sine, Karhunen-Loeve, slant, or Haar transforms.

Figure 6:
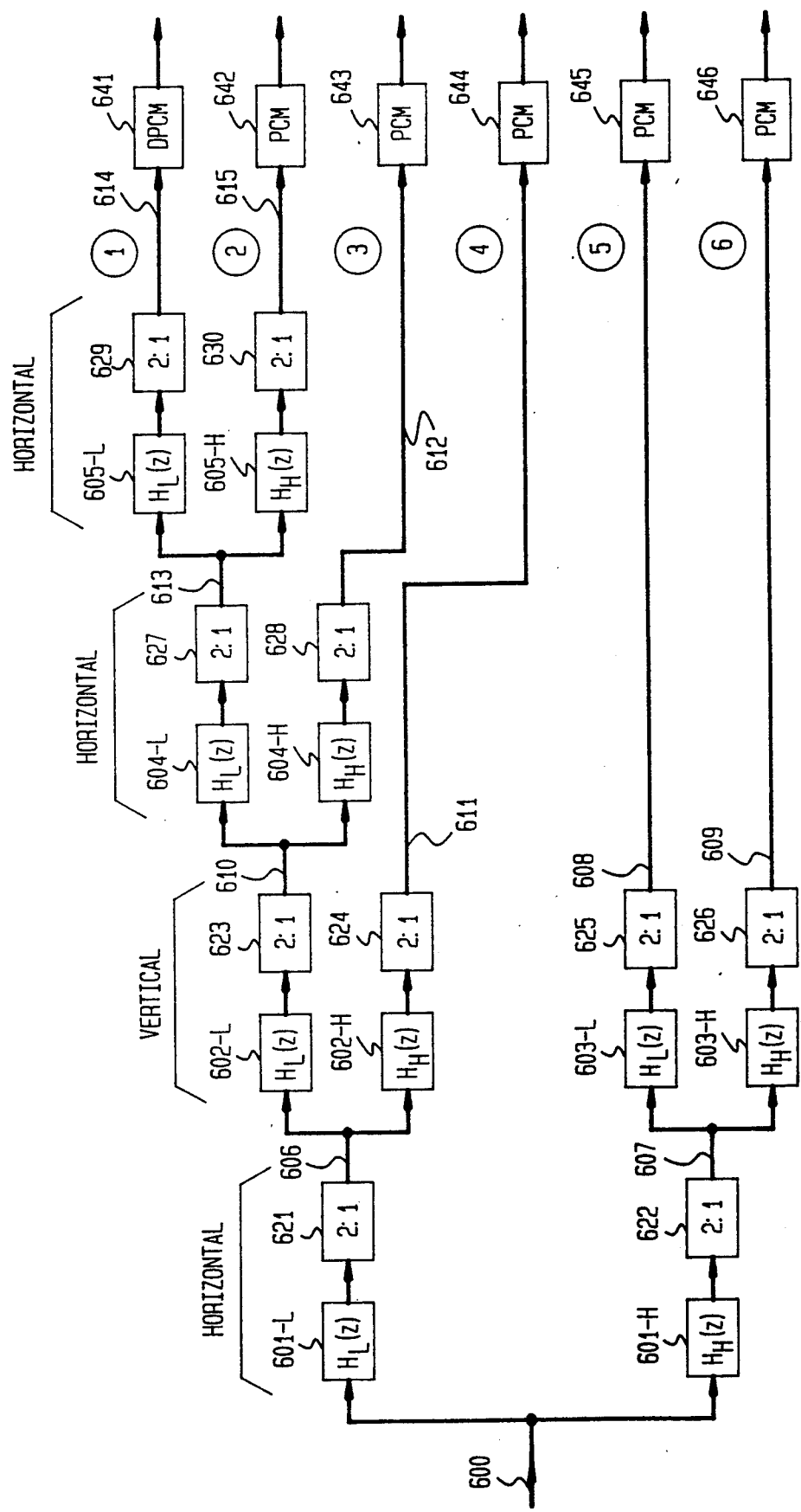
FIG. 6 is a block diagram of an illustrative embodiment of our invention comprising a sub-band coder realization of the multiple block-size Hadamard decomposition in FIG. 5.

FIG. 6 shows a sub-band structure realization of the above-described multiple block-size HT decomposition in accordance with out invention. The input signal on line 600 is filtered by low and high pass filters 601-L and 601-H, respectively. These filters are defined by the following transfer functions:

$$H_L(z) = 0.5 + 0.5z^{-1} \tag{1}$$

$$H_H(z) = 0.5 - 0.5z^{-1} \tag{2}$$

Figure 7:
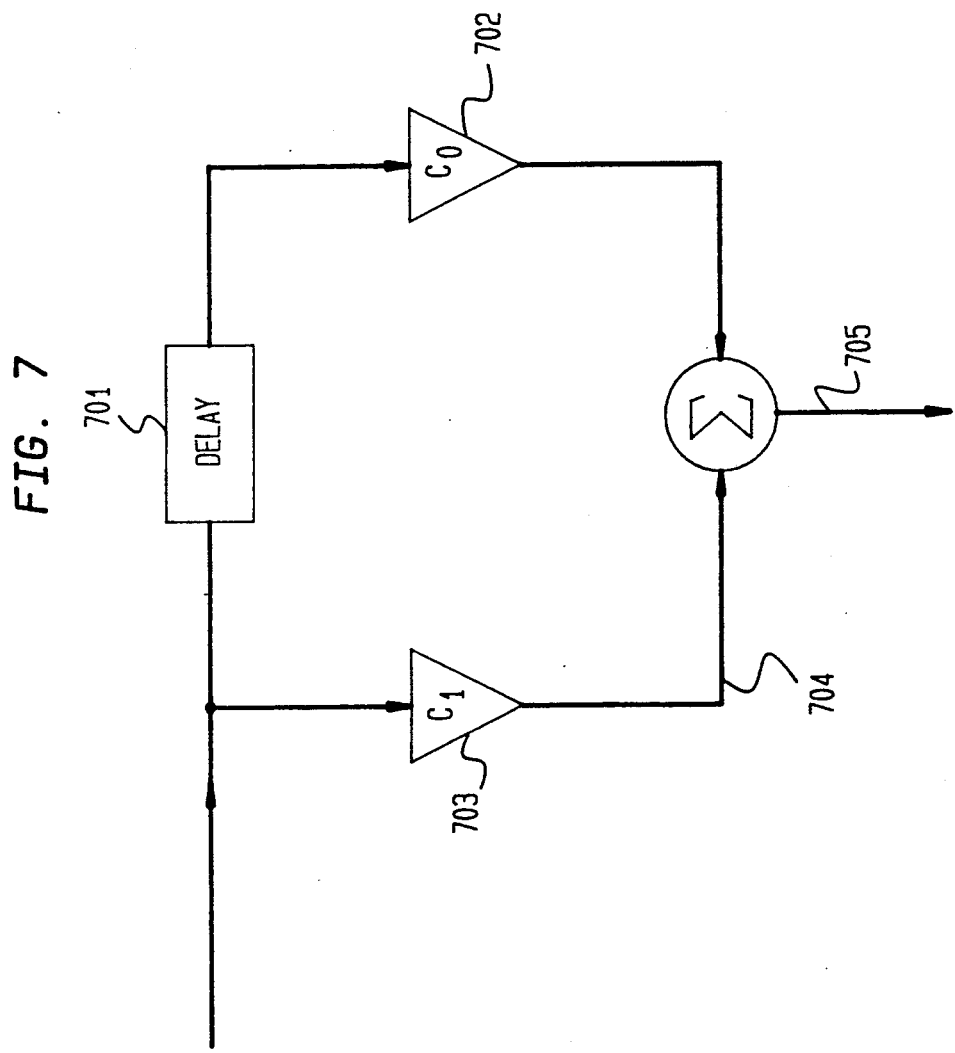
FIG. 7 is a diagram of the two-tap short kernel FIR filter used in the sub-band coder of FIG. 6.

These filters are short kernel two-tap FIR filters of a type illustrated in FIG. 7. Each filter includes a delay storage element 701 and two multipliers 702 and 703 having multiplier coefficients $c_0$ and $c_1$, respectively. Because the coefficients are particularly simple, multiplication can be implemented by a simple shift operation. The outputs of multipliers 702 and 703 are summed by adder 704 to produce an output on 705. The output thus is equal to:

$c_0 \times$ the delayed input $+ c_1 \times$ the current input.

The coefficients for the low- and high-pass filters are therefore (0.5,0.5) and (0.5, −0.5), respectively. Filters 601-L and 601-H decompose, in the horizontal direction, the input pixel information on line 600 into two sub-bands. The delay storage element 701 in these two filters is therefore one pixel long. To maintain the total number of samples at the outputs of filters 601-L and 601-H at the same number as are at the input to these filters, alternate outputs of these filters are eliminated by decimators 621 and 622, respectively. For the input sequence of pixels {a,b,c,d,e,f,g,h, . . . i,j,k,l,m,n,o,p}, as in the previous discussion of the Hadamard decompsoition of the input block, the decimated low-band output sequence of filter 601-L on line 606 consists of {a+b,c+d,e+f,g+h, . . . , i+j,k+l,m+n,o+p, . . . }, (times the scaling coefficient of 0.5). The corresponding high-band output sequence on line 607 consists of {a−b,c−d,e−f,g−h, . . . ,i−j,k−l,m−n,o−p, . . . }. These outputs are noted to be equal to the outputs of the first stage of the $2 \times 1$ HT of the input block in FIG. 5.

The low- and high-band sequences on lines 606 and 607 are now decomposed in the vertical direction. The two-tap filters that decompose these sequences thus require storage elements one scan line long. Filters 603-L and 603-H decompose the high horizontal band sequence on line 607 into low and high bands, respectively, in the vertical direction. The resulting sequences are decimated by decimators 625 and 626 to produce a high horizontal-low vertical output sequence on line 608 of $\{a-b+i-j, c-d+k-l, e-f+m-n, g-h+o-p, \ldots\}$ (times the scaling constant) and a high horizontal-high vertical output sequence on line 609 of $\{a-b-i+j, c-d-k+l, e-f-m+n, g-h-o+p, \ldots\}$ (times the scaling constant). These sequences correspond to the bands labeled "5" and "6" in FIG. 5 and are similarly labeled in FIG. 6.

In a similar manner, filters 602-L and 602-H decompose the low horizontal band sequence on line 606 into low and high bands, respectively, in the vertical direction. The resulting low horizontal-high vertical band sequence on line 611, after decimation by decimator 624, is $\{a+b-i-j, c+d-k-l, e+f-m-n, g+h-o-p, \ldots\}$ (times the scaling constant), which corresponds to the band labeled "4" in FIG. 5. The corresponding decimated low horizontal-low vertical band sequence on line 610 is $\{a+b+i+j, c+d+k+l, e+f+m+n, g+h+o+p, \ldots\}$ (times the scaling constant). This low-band sequence is further decomposed in the horizontal direction by filters 604-L and 604-H. After decimation by decimator 628, the resulting low horizontal-low vertical-high horizontal band sequence on line 612 is $\{a+b+i+j-c-d-k-l, e+f+m+n-g-h-o-p, \ldots\}$ (times the scaling constant), which corresponds to the band labeled "3" in FIG. 5. The corresponding decimated low horizontal-low vertical-low horizontal band sequence on line 613 is $\{a+b+i+j+c+d+k+l, e+f+m+n+g+h+o+p, \ldots\}$ (times the scaling constant). This sequence is further decomposed in the horizontal direction by filters 605-L and 605-H. The decimated low horizontal-low vertical-low horizontal-low horizontal band output sequence of filter block 605-L on line 614 is $\{a+b+i+j+c+d+k+l+e+f+m+n+g+h+o+p, \ldots\}$ (times the scaling constant) and the decimated low horizontal-low vertical-low horizontal-high horizontal band output sequence of filter 605-H on line 615 is $\{a+b+i+j+c+d+k+l-e-f-m-n-g-h-o-p, \ldots\}$ (times the scaling constant). These output sequences correspond to the bands labeled "1" and "2", respectively, in FIG. 5.

Note that in the structure of FIG. 6, the order of the first stage horizontal processing and the second stage vertical processing can be interchanged without changing the decomposition products. Furthermore, analogous temporal processing, i.e. frame-to-frame processing based on the sums and differences of successive frames, can also be employed to further improve the performance of this coding technique.

It can be seen that the six sub-bands, labeled "1" through "6" in FIG. 6, are equivalent to the Hadamard multiple block size structure in FIG. 5. From the discussion above, it is noted that the sequences in bands 4, 5 and 6 are outputted at a rate that is twice the rate of band 3 and four times the rate of bands 1 and 2.

The band 1 signal on line 614 is encoded with a DPCM coder 641 using previous pixel prediction. The band 2 signal on line 615, the band 3 signal on line 612, the band 4 signal on line 611, the band 5 signal on line 608, and the and 6 signal on line 609 are encoded by PCM coders 642, 643, 644, 645, and 646, respectively. Coders 641-646 are the DPCM and PCM coders 104 in FIG. 1. These six quantized bands that are generated in parallel are stored in the shuffle memory 105 (in FIG. 1) and converted to a "band-wise" sequential order (band-1, followed by band-2, followed by band-3, etc.) suitable for interblock coding by the entropy coder 106.

Figure 8:
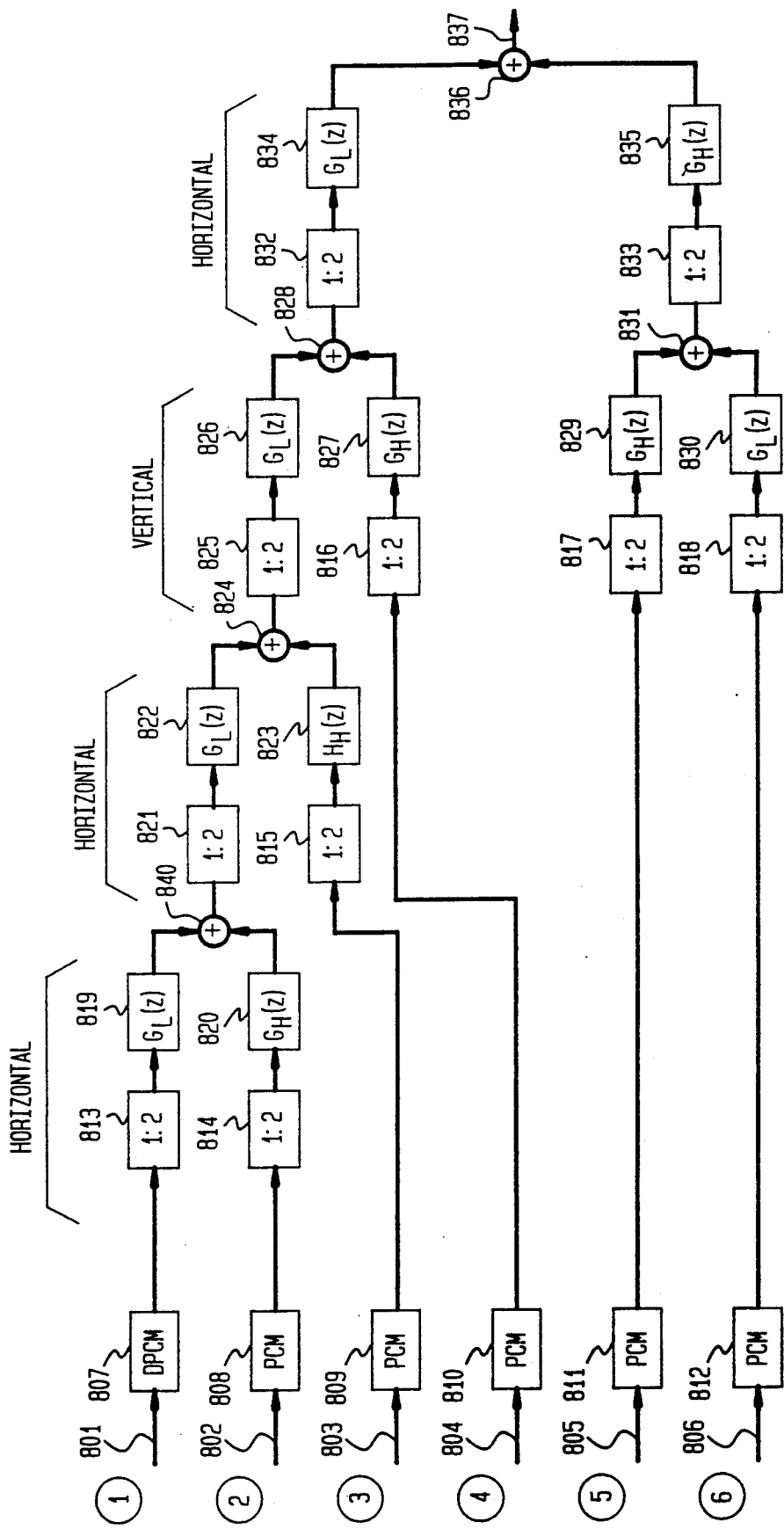
FIG. 8 is a block diagram of the sub-band decoder that corresponds to the sub-band coder in FIG. 6 in accordance with our invention.

FIG. 8 is a block diagram of the corresponding sub-band decoder comprising the DPCM and PCM decoders 113 and sub-band reconstructor 114 at the receiving end of the transmission system in FIG. 1. The six separate band signals arriving on line 801-806 from shuffle memory 112 (in FIG. 1) are input to DPCM decoder 807 and PCM decoders 808-812, respectively. These decoders convert to coded DPCM and PCM samples back to streams of sub-band sample magnitudes. The resultant six sub-band signals are then used to reconstruct the original signal. The first step in the synthesis operation is an interpolation step which is carried out in each band by interpolators 813-818. Interpolation involves increasing the number of samples comprising each sub-band signal by adding samples having a zero value. (This is the inverse of the decimation operation.) This increases the number of samples in each sub-band by a factor of two. The next steps in the synthesis operation successively reduce the number of sub-band signals by low-pass and high-pass filtering and combining filtered sub-bands in a manner that mirrors the decomposition stages at the transmitting end of the system. The low-pass and high-pass filters employed at each stage are defined by the following transfer functions:

$$G_L(z) = 1 + z^{-1} \quad (3)$$

$$G_H(z) = -1 + z^{-1} \quad (4)$$

These filters, as the low and high pass filters in the transmitter, are two-tap FIR filters of the type in FIG. 7. and having coefficients (1,1) and (−1,1), respectively.

The interpolated band 1 and band 2 sequences are filtered in the horizontal direction by low-pass and high-pass filters 819 and 820, respectively and combined by adder 840. The resultant sequence is interpolated by interpolator 821 and filtered in the horizontal direction by low-pass filter 822. The interpolated band 3 signal is filtered in the horizontal direction by high-pass filter 823 and combined with the output of filter 822 by adder 824. This resultant sequence is interpolated by interpolator 825 and filtered in the vertical direction by low-pass filter 826. The interpolated band 4 sequence is filtered in the vertical direction by high-pass filter 827 and combined with the output of filter 826 by adder 828. The interpolated band 5 and band 6 sequences are filtered by low-pass filter 829 and high-pass filter 830, respectively, and combined by adder 831. The output sequences of adders 828 and 831 are interpolated by interpolators 832 and 833, and filtered in the horizontal direction by low-pass and high-pass filters 834 and 835, respectively. The resultant two bands of sequences are combined by adder 836 into a single sequence on line 837. It can be readily shown, absent any quantization noise, that the output sequence on line 837 will be an exact reproduction of the input sequence on line 600 at the transmitting end in FIG. 6.

The six-band asymmetrical two-dimensional sub-band coder structure of FIG. 6 incorporating two-tap QMF pairs has been found to represent an excellent balance between picture quality and system complexity for the coding of HDTV signals at a desired rate of approximately 3.0 bits-per-pixel (bpp). Other embodiments of the present invention have been investigated such as an eight-band (horizontal only) decomposition. Three, four and five band two-dimensional (horizontal and vertical) multistage sub-band structures based exclusively on the two-tap QMF pairs were also analyzed.

The six-band system described in detail hereinabove, however, was found capable of eliminating most moving artifacts in the reconstructed signal within the entropy budget of less than 3.0 bpp. Further increases in the number of bands have not been found to neccessarily yield improved visual quality due to the noise characteristics produced in the different bands and the manner in which they combine.

The above-described embodiment is illustrative of the principles of the present invention. Other embodiments could be devised by those skilled in the art without departing from the spirit and scope of the present invention.

What is claimed is:

1. A method of coding a video signal comprising the steps of:
    decomposing said video signal into a plurality of sub-band streams of samples by applying said video signal to an asymmetric multiple-stage structure of filter pairs, the filters in each stage being two-tap finite impulse response filters having equal magnitude coefficients which produce low-band and high-band output signals; and
    separately coding each sub-band stream.

2. The method of claim 1 further comprising the steps of rearranging the separately coded sub-band streams into a single stream such that each of the coded sub-band streams is serially sequenced band-by-band in the signle stream, and entropy coding the single stream for transmission.

3. The method of claim 1 wherein at a first stage a first filter pair filters said video signal horizontally or vertically into low-band and high-band signals, at a second stage a second filter pair filters the high-horizontal/vertical band signal of the first stage and a third filter pair filters the low-horizontal/vertical band signal of the first stage in a direction opposite to that filtered in the first stage, at a third stage a fourth filter pair filters the low-horizontal/vertical low-vertical/horizontal signal horizontally, and at a fourth stage a fifth filter pair filters the low-horizontal/vertical low-vertical/horizontal low-horizontal signal horizontally.

4. The method of claim 3 wherein the low-horizontal/vertical low-vertical/horizontal low-horizontal low-horizontal signal is DPCM coded.

5. A sub-band coder for a video signal comprising:
    means for receiving said video signal, asymmetric multiple-stage filter means for decomposing said video signal into plural streams of sub-band samples, said asymmetric multiple-stage filter means comprising filter pairs at each stage, the filter pair at each stage being two-tap finite impulse response filters having equal magnitude coefficients which produce low-band and high-band signals; and
    plural coding means for separately coding each of said streams of sub-band signals.

6. The sub-band coder of claim 5 further comprising means for rearranging the separately coded sub-band streams into a single stream such that each of the coded sub-band streams is serially sequenced band-by-band in the single stream, and means for entropy coding the single stream for transmission.

7. The sub-band coder of claim 5 wherein said asymmetric multiple-stage filter means comprises at a first stage a first filter pair to filter said video signal horizontally or vertically into low-band and high-band signals, at a second stage a second filter pair to filter the high-band signal of the first stage and a third filter pair to filter the low-band signal of the first stage in a direction opposite to that filtered in the first stage, at a third stage a fourth filter pair to filter the low-horizontal/vertical low-vertical/horizontal signal horizontally, and at a fourth stage a fifth filter pair to filter the low-horizontal/vertical low-vertical/horizontal low-horizontal signal horizontally.

8. The sub-band coder of claim 7 wherein the coding means for coding the low-horizontal/vertical low-vertical/horizontal low-horizontal low-horizontal signal comprises a DPCM coder.

9. A sub-band coding system for a video signal comprising:
    at a transmitting end, asymmetric multiple-stage filter means for decomposing said video signal into plural streams of sub-band samples, said asymmetric multiple-stage filter means comprising filter pairs at each stage, the filter pair at each stage being two-tap finite impulse response filters having equal magnitude coefficients which produce low-band and high-band signals, plural coding means for separately coding each of said streams of sub-band signals, means for rearranging the separately coded sub-band streams into a single stream such that each of the plural coded streams is serially sequenced band-by-band in the single stream, and means for entropy coding the single stream for transmission; and
    at a receiving end, means for entropy decoding the received stream, means for forming plural received coded sub-band streams from the entropy decoded stream, plural decoding means for separately decoding each of said plural received coded sub-band streams, and asymmetric multiple-stage filter means for reconstructing said video signal from the plural decoded received sub-band streams, said asymmetric multiple-stage filter means comprising filter pairs at each stage, the filter pair at each stage being two-tap finite impulse response filters having equal magnitude coefficients which produce low-band and high-band signals.

10. A method of transmitting video signals between a transmitting and receiving end comprising the steps of:
    at the transmitting end, decomposing said video signal into a plurality of sub-band streams of samples by applying said video signal to an asymmetric multiple-stage structure of filter pairs, the filters in each stage being two-tap finite impulse response filters having equal magnitude coefficients which produce low-band and high-band output signals, separately coding each sub-band stream, rearranging the separately coded sub-band streams into a single stream such that each of the coded sub-band streams is serially sequenced band-by-band in the single stream, and entropy coding the single stream for transmission; and
    at the receiver, entropy decoding the received stream, forming plural received coded sub-band streams from the entropy decoded stream, separately decoding each of the received coded sub-band streams, and reconstructing said video signal from the plural decoded received sub-band streams by applying said plural decoded sub-band streams to an asymmetric multiple-stage structure of filter pairs, the filters in each stage being two-tap finite impulse response filters having equal magnitude coefficients which produce low-band and high-band signals.

* * * * *